United States Patent
Shimomura

[11] Patent Number: 6,091,351
[45] Date of Patent: Jul. 18, 2000

[54] A/D CONVERTER AND LEVEL SHIFTER

[75] Inventor: Takehiko Shimomura, Tokyo, Japan

[73] Assignee: Mitsubishi Denki Kabushiki Kaisha, Tokyo, Japan

[21] Appl. No.: 09/076,073

[22] Filed: May 12, 1998

[30] Foreign Application Priority Data

Jan. 7, 1998 [JP] Japan ................................. 10-001438

[51] Int. Cl.⁷ .................................................... H03M 1/12
[52] U.S. Cl. ................................ 341/155; 326/68; 326/81
[58] Field of Search ........................... 341/155; 326/68, 326/81, 83

[56] References Cited

U.S. PATENT DOCUMENTS 5,659,258  8/1997  Tanabe et al. ............................ 326/68

FOREIGN PATENT DOCUMENTS 4-329024  11/1992  Japan .
5-19891    1/1993  Japan .
5-303656  11/1993  Japan .

*Primary Examiner*—Michael Tokar
*Assistant Examiner*—Jean B. Jeanglaude
*Attorney, Agent, or Firm*—Burns, Doane, Swecker & Mathis, LLP

[57] ABSTRACT

An analog section (4) including the selector for analog input terminals, ladder resistors, a decoder for decoding the output of the ladder resistors, a chopper amplifier, and a sample and hold circuit, is operated by 5 V power-supply system. A digital section (5) that generates a control signal for controlling the operation of the analog section 4 is operated by 3.3 V power-supply system. No design change of a sensor connected from outside a microcomputer is required.

20 Claims, 5 Drawing Sheets

A/D CONVERTER AND LEVEL SHIFTER

BACKGROUND OF THE INVENTION

1. Field of the Invention

The present invention relates to a level shifter intervening between different voltage power-supply systems and to an analog-to-digital converter (referred to as A/D converter in this specification and claims) employing the level shifter.

2. Description of the Background Art

FIG. 9 is a block diagram showing the configuration of a conventional microcomputer 1. The microcomputer 1 comprises a CPU 2, an A/D converter 3, peripheral modules 7, 8, and an I/O interface 6. The A/D converter 3 comprises an analog section 4 and a digital section 5.

Power-supply VCC for digital circuit is applied to the CPU 2, the digital section 5 of the A/D converter 3, the I/O interface 6, and the peripheral modules 7, 8. Power-supply AVCC for analog circuit and a reference power-supply AVRFF provided in ladder resistors (not shown) that is normally equipped with the analog section 4, are applied to the analog section 4 of the A/D converter 3. A ground power-supply for digital circuit (not shown) is applied to the CPU 2, the digital section 5, and the peripheral modules 7, 8, respectively. A ground power-supply for analog circuit (not shown) is applied to the analog section 4.

There is, however, a first demand that the microcomputer 1 is protected from electromagnetic interference by preventing the switching noise of an output buffer (not shown) which is generally provided in the I/O interface 6 and the noise from the outside from being transferred to the inside. Therefore, the power-supply which is applied to the CPU 2, the digital section 5, and the peripheral modules 7, 8 is preferably provided separately from the power-supply applied to the I/O interface 6.

There is also a second demand that unnecessary radiation from the power dissipated by the CPU 2 and the peripheral modules 7, 8, and from an oscillation circuit (which is for example provided in the peripheral module 8 in order to produce a clock for controlling the operation of the microcomputer 1) is suppressed. It is therefore preferable that the voltage of power-supply applied to the CPU 2, the digital section 5, and the peripheral modules 7, 8, is lower than the voltage of power-supply applied to the I/O interface 6.

FIG. 10 is a block diagram showing a schematic configuration of a microcomputer 1 that has been improved based on the above stated thoughts. An internal logic circuit 14 indicates a collection of a CPU 2 and peripheral modules 7, 8. Power-supply VCCE for internal logic circuit is applied to the internal logic circuit 14. Power-supply VCCI for I/O interface is applied to an I/O interface 6. The power-supply VCCE for internal logic circuit and the power-supply VCCI for I/O interface apply a voltage VCCE and a voltage VCCI, respectively, which are different from each other (hereinafter the same symbol is used for a power-supply and the voltage applied by the power-supply). For instance, VCCI is set to 5 V, and VCCE is set to 3.3 V.

Since power-supply wires transmitting a different voltage are not connected to each other, the noise occurred in the I/O interface 6 or the noise from the exterior is not propagated to the internal logic circuit 14, avoiding the malfunction of the microcomputer 1. Thus, when systems are designed on user ends, it is unnecessary to take electromagnetic interference measures This satisfies the first demand. At the same time, it is possible to reduce power dissipation and to suppress the unnecessary radiation from the oscillation circuit provided in the peripheral module 8. This satisfied the second demand.

If the microcomputer 1 is configured by using a plurality of power-supplies differ in voltage system as discussed above, it is required to match the signal voltage between circuits operating in dissimilar power-supplies.

FIG. 11 shows a configuration which differs from the configuration of FIG. 10 in that a level shifter 11a for performing the level shift of a signal voltage traveling between an internal logic circuit 14 and an I/O interface 6 is added therebetween. Such techniques that the voltage of power-supply for an I/O circuit is different from that for a logic circuit, and the levels of signal voltages traveling between the two are matched, are disclosed in Japanese Patent Laid-Open Gazette 5-19891, Japanese Patent Laid-Open Gazette 5-303656, and Japanese Patent Laid-Open Gazette 4-329024.

In addition to the second demand, there is a third demand that an increase in cost is avoided by requiring no design changes of a sensor connected from outside the microcomputer 1. However, the second and third demands cannot be satisfied only by providing a difference in the voltage of power-supply between an I/O interface 6 and an internal logic circuit 14.

SUMMARY OF THE INVENTION

According to the present invention, an A/D converter comprises: an analog section having a functional block for performing an A/D conversion, to which a first voltage is applied; a digital section generating a control signal for controlling an operation of the analog section, to which a second voltage having an absolute value smaller than that of the first voltage is applied; and a level shifter shifting a level of the control signal depending on a difference between the first and second voltages and transmits it to the analog section.

Preferably, the A/D converter of the first aspect is characterized in that the level shifter is placed between the analog section and the digital section.

Preferably, the A/D converter of the first aspect is characterized in that the level shifter comprises: an input terminal to which the control signal is fed; an output terminal for outputting the control signal with shifted level; a first path having two ends between which the first voltage is applied, and first and second transistors of different conductivity type which are connected in series between the two ends; a logic circuit to which the second voltage is applied, having an input end connected to the input terminal, and an output end connected to a control end of the second transistor; a second path having a third transistor of a conductivity type identical with the second transistor, the third transistor including a first current end connected to a first current end of the second transistor, a second current end connected to a control end of the first transistor, and a control end connected to the input terminal; and a potential forced circuit to which the first voltage is applied, connected to the output terminal, the output terminal being connected to one of current ends of the first transistor closer to the second transistor.

Preferably, the A/D converter of the third aspect is characterized in that: the level shifter further comprises a fourth transistor having a conductivity type identical with the first transistor, the fourth transistor including a first current end, a second current end connected to the second current end of the third transistor, and a control end connected to the output terminal; and that the first voltage is applied between the first current end of the third transistor and the first current end of the fourth transistor.

Preferably, the A/D converter of the third aspect is characterized in that the potential forced circuit is a pull-up circuit.

Preferably, the A/D converter of the third aspect is characterized in that the potential forced circuit is a pull-down circuit.

Preferably, the AID converter of the third aspect is characterized in that the potential forced circuit is a latched circuit.

Preferably, the A/D converter of the third aspect is characterized in that: the first path further has a fourth transistor intervened in series between the output terminal and the second transistor; the second path further has a fifth transistor having a conductivity type identical with the fourth transistor, the fifth transistor being intervened in series between the second current end of the third transistor and the control end of the first transistor; and the level shifter further comprises a control terminal connected in common to control ends of the fourth and fifth transistors.

Preferably, the A/D converter of the eighth aspect is characterized in that: the level shifter further comprises a sixth transistor having a conductivity type identical with the first transistor, the sixth transistor including a first current end, a second current end connected to the second current end of the fifth transistor, and a control end connected to the output terminal; and the first voltage is applied between the first current end of the sixth transistor and the first current end of the third transistor.

Preferably, the A/D converter of the eighth aspect is characterized in that the potential forced circuit is a pull-up circuit.

Preferably, the A/D converter of the eighth aspect is characterized in that the potential forced circuit is a pull-down circuit.

Preferably, the AID converter of the eighth aspect is characterized in that the potential forced circuit is a latched circuit.

According to the present invention, a level shifter comprises: an input terminal; an output terminal for outputting a signal fed to the input terminal with shifted level; a first path having two ends between which a first voltage is applied, and first and second transistors of different conductivity type which are connected in series between the two ends; a logic circuit to which a second voltage different from the first voltage is applied, having an input end connected to the input terminal, and an output end connected to a control end of the second transistor; a second path having a third transistor of a conductivity type identical with the second transistor, the third transistor including a first current end connected to a first current end of the second transistor, a second current end connected to a control end of the first transistor, and a control end connected to the input terminal; and a potential forced circuit to which a first voltage is applied, connected to the output terminal, the output terminal being connected to one of current ends of the first transistor closer to the second transistor.

Preferably, the level shifter of the thirteenth aspect is characterized in that the potential forced circuit is a pull-up circuit.

Preferably, the level shifter of the thirteenth aspect is characterized in that the potential forced circuit is a pull-down circuit.

Preferably, the level shifter of the thirteenth aspect is characterized in that the potential forced circuit is a latched circuit.

Preferably, the level shifter of the thirteenth aspect further comprises a control terminal and is characterized in that: the first path further has a fourth transistor intervened in series between the output terminal and the second transistor; the second path further has a fifth transistor having a conductivity type identical with the fourth transistor, the fifth transistor being intervened in series between the second current end of the third transistor and the control end of the first transistor; and the control terminal is connected in common to control ends of the fourth and fifth transistors.

Preferably, the level shifter of the seventeenth aspect is characterized in that the potential forced circuit is a pull-up circuit.

Preferably, the level shifter of the seventeenth aspect is characterized in that the potential forced circuit is a pull-down circuit.

Preferably, the level shifter of the seventeenth aspect is characterized in that the potential forced circuit is a latched circuit In a first aspect of the present invention, it is possible to suppress the power dissipated in the digital section than prior art, without changing conventional designs of an exterior sensor that feeds an analog signal to the analog section.

In a second aspect of the present invention, even when the first voltage is applied before applying the second voltage, the output terminal does not become a floating state. When the first and second voltages are both applied, the level of the control signal is shifted depending on the difference between the first and second voltages.

In a third aspect of the present invention, it is possible to separate the first transistor and the potential forced circuit from second and third transistors by feeding, to the control terminal, a reset signal of a device in which the A/D converter is employed, e.g., microcomputer. Thus, an unstable operations of the logic circuit and the second transistor before applying the second voltage can be eliminated more satisfactorily so that the potential of the output terminal is forced to be set.

In a fourth aspect of the present invention, even when the first voltage is applied before applying the second voltage, the output terminal does not become a floating state. When the first and second voltages are both applied, the level of a signal fed to the input terminal is shifted depending on the difference between the first and second voltages.

In a fifth aspect of the present invention, it is possible to separate the first transistor and the potential forced circuit from second and third transistors by applying a potential corresponding to a predetermined logic value to the control terminal Thus, an unstable operations of the logic circuit and the second transistor before applying the second voltage can be eliminated more satisfactorily so that the potential of the output terminal is forced to be set.

Thus, it is an object of the present invention to provide a technique of applying a voltage different from that applied to an internal logic circuit, to circuits other than an I/O interface.

These and other objects, features, aspects and advantages of the present invention will become more apparent from the following detailed description of the present invention when taken in conjunction with the accompanying drawings.

DESCRIPTION OF THE PREFERRED EMBODIMENTS

Basic Thought

Prior to the description of preferred embodiments of the present invention, the basic thought of the present invention is described. To satisfy the second demand, it is necessary to reduce the potential of power-supply. On the other hand, to satisfy the third demand, it is necessary that the potential of power-supply for a circuit which processes the information from a sensor connected from outside a microcomputer 1, is made equal to that of prior art. Thus, in an A/D converter 3 of the present invention, the voltage of power-supply applied to an analog section 4 which receives the analog information from a sensor is made equal to that of prior art, and there is lowered the voltage of power-supply applied to a digital section 5 from which a digital data after subjected to an A/D conversion is outputted for the operation in a CPU 2.

Figure 12:
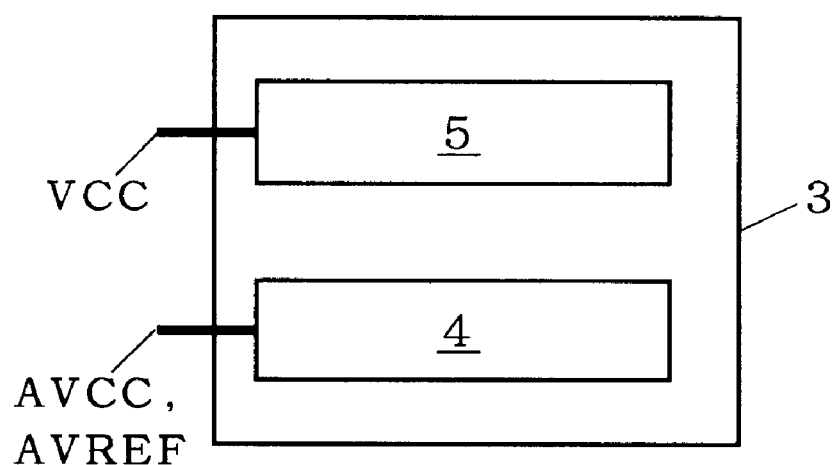
FIG. 12 is a block diagram for explaining the basic thought of the present invention.

FIG. 12 is a block diagram showing the configuration of the A/D converter 3. Taking the first to third demands into account, the power-supply AVCC for analog circuit and reference power-supply AVREF applied to an analog section 4 are both set to for example 5 V as in prior art, and the power-supply VCC for digital circuit applied to a digital section 5 is set to for example 3.3 V as in the power-supply VCCE for internal logic circuit, which is applied to an internal logic circuit 14. The voltage of the power-supply VCCI for I/O applied to an I/O interface 6 is also preferably set to 5 V, as previously described.

Hereinafter, the power-supply applied by a pair of a potential 5 V and a ground potential is referred to as 5 V power-supply system. Similarly, the power-supply applied by a pair of a potential 3.3 V and a ground potential is referred to as 3.3 V power-supply system. Accordingly, it can be expressed that 5 V power-supply system is applied to the analog section 4, and 3.3 V power-supply system is applied to the digital section 5.

As circuits constituting the analog section 4 of the A/D converter 3, there are functional blocks performing A/D conversion, e.g., the selector for analog input terminals, ladder resistors, a decoder for decoding the outputs of the ladder resistors, a chopper amplifier, and a sample hold circuit, which are all well-known. As circuits constituting the digital section 5, there are known control circuits that generate a control signal for controlling the operation of the analog section 4 as mentioned above. To drive such control circuit by a power-supply of a low voltage system (i.e., one having a smaller absolute value of a voltage to be applied) is effective in suppressing the dissipation power and noise. Examples of control signals include a signal to determine which input terminal is to be selected by the selector for analog input terminals, a signal to determine from which connection of ladder resistors a divided potential is to be taken, a signal to determine the sampling period and decision period of a chopper amplifier, and a signal to drain the electric charge of the capacitor of a chopper section before/after a conversion.

First Preferred Embodiment

Figure 1:
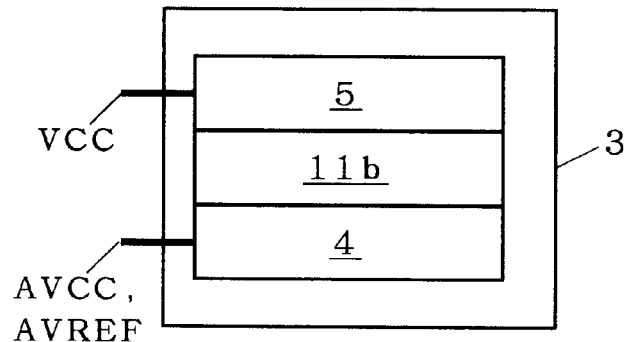
FIG. 1 is a block diagram showing a configuration of a first preferred embodiment of the present invention.

FIG. 1 shows the configuration of an A/D converter 3 according to a first preferred embodiment of the present invention. As stated in the foregoing Basic Thought, in the present invention the voltage of power-supply applied to an analog section 4 differs from that applied to a digital section 5. In this embodiment a level shifter 11b is intervened between the analog section 4 and the digital section 5.

Figure 9:
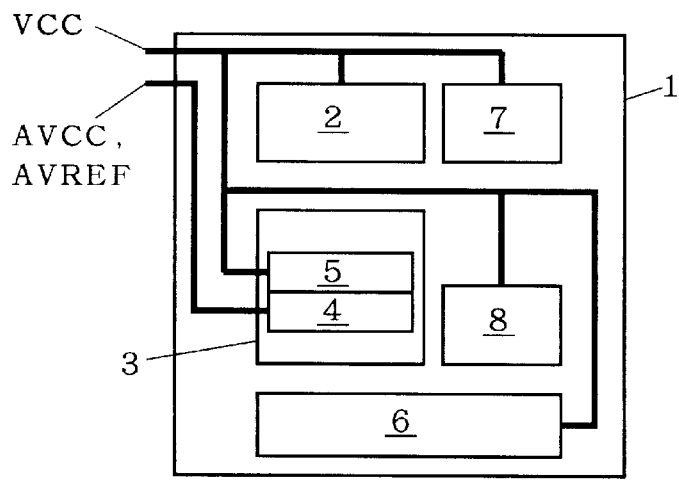
FIG. 9 is a block diagram showing a configuration of a conventional microcomputer.
Figure 10:
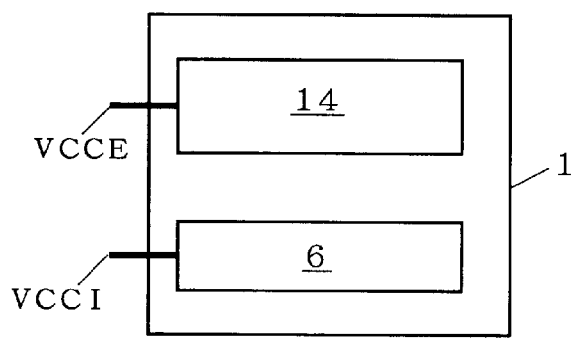
FIG. 10 is a block diagram showing a conventional technique.
Figure 11:
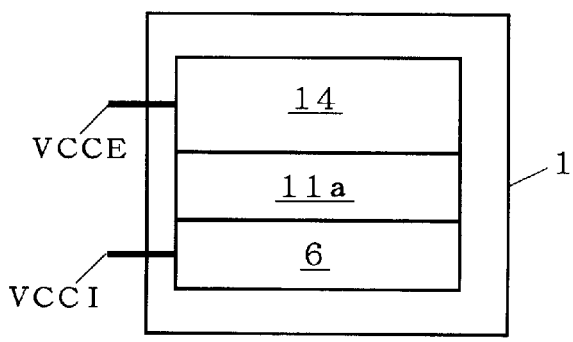
FIG. 11 is a block diagram showing another conventional technique.

Conventionally, the analog section 4 and the digital section 5 have been placed apart as shown in FIGS. 9 and 12. When a level shifter 11b is added, it is intervened between the two, as shown in FIG. 1. Therefore, it is possible to minimize the delay of the control signal and thus prevent the conversion accuracy from being decreased. In addition, it is possible to utilize the property of conventional circuit arrangements.

Figure 2:
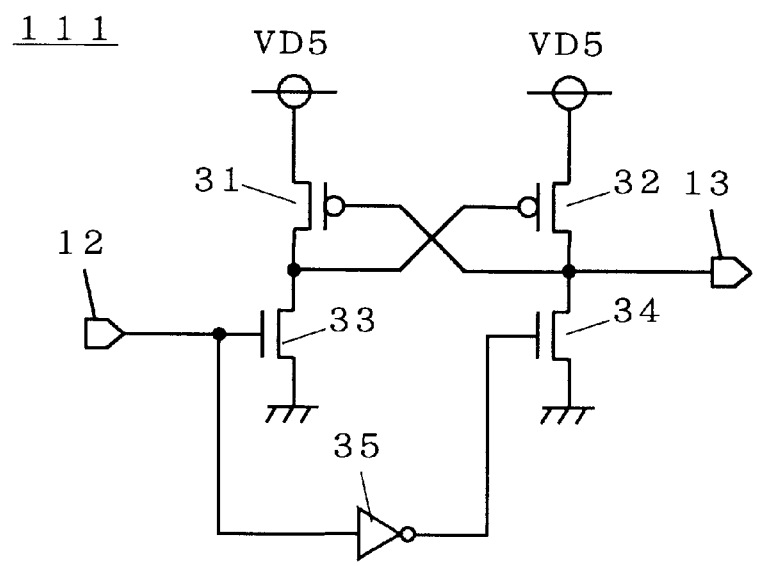
FIG. 2 is a circuit diagram for explaining the first preferred embodiment.

FIG. 2 is a circuit diagram showing the configuration of a level shift element 111 which can be employed as a component of the level shifter 11b. The level shifter 11b amplifies the voltage of one of the signals that are generated in the digital section 5 by using 3.3 V power-supply system and propagates it to the analog section 4.

The level shifter 11b has an input terminal 12 and an output terminal 13, and also has an inverter 35 that has an input end connected to the input terminal 12 and operates in 3.3 V power-supply system.

Figure 3:
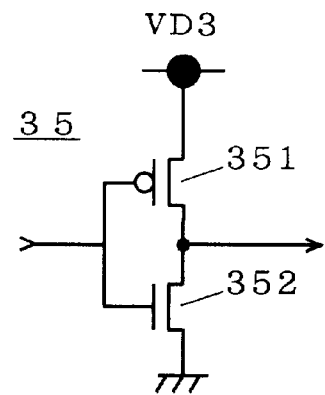
FIG. 3 is another circuit diagram for explaining the first preferred embodiment.

FIG. 3 is a circuit diagram showing an example of the configuration of the inverter 35. A power-supply VD 3 applies a voltage equal to that applied by a power-supply VCC for digital circuit, for example 3.3 V. The inverter 35 comprises a PMOS transistor 351 and an NMOS transistor 352 which are connected in series between the power-supply VD3 and a ground. The gates of both transistors are connected to each other and its connection point forms an input end of the inverter 35, and the drains of both transistors are connected to each other and its connection point forms an output end of the inverter 35.

Referring again to FIG. 2, the level shift element 111 further comprises PMOS transistors 31, 32, and NMOS transistors 33, 34. Each source of the transistors 31, 32 is connected to a power-supply VD5. The power-supply VD5 applies a voltage equal to that applied by a power-supply AVCC for analog circuit, for example 5 V. Each source of the transistors 33, 34 is grounded. The gate of the transistor 31, the drain of the transistor 32, and the drain of the transistor 34 are connected in common to the output terminal 13. The gate of the transistor 32, the drain of the transistor 31, and the drain of the transistor 33 are connected in common. The gates of the transistors 33, 34 are connected to the input end and the output end of the inverter 35, respectively.

A control signal fed to the input of the inverter 35 through the input terminal 12 is one generated by 3.3 V power-supply system. Since the inverter 35 operates in 3.3 V power-supply system, the potential corresponding to a logic opposite to a logic that corresponds to the potential applied to the gate of the transistor 33 is applied to the gate of the transistor 34, and a control signal that swings between the power-supply VD5 and the ground potential is obtained from the output terminal 13. This enables to amplify the voltage of the control signal.

It is unnecessary to provide a level shifter for reducing the voltage of a signal directed from the analog section 4 to the digital signal 5. This is because it is possible to avoid the breakdown of the digital signal 5 by increasing its breakdown voltage, e.g., by thickening a gate oxide film of an MOS transistor constituting an input stage of the digital section 5.

Second Preferred Embodiment

In the level shift element 111 of the first preferred embodiment, the potential of the output terminal 13 might become unstable, as in the case where 5 V power-supply system starts before 3.3 V power-supply system starts. In such a case, the inverter 35 does not operate, and the operations of the transistors 31 to 34 are unstable. This might result in that the output terminal 13 is in the floating state. If the potential of the output terminal 13 remains unstable, a penetrating current might flow the logic gate of the analog section 4. As a result, a signal for controlling the chopper amplifier is asserted, and a signal for draining the electric charge stored in the capacitor of the chopper section is also asserted. The second preferred embodiment describes a technique for avoiding these situations.

Figure 4:
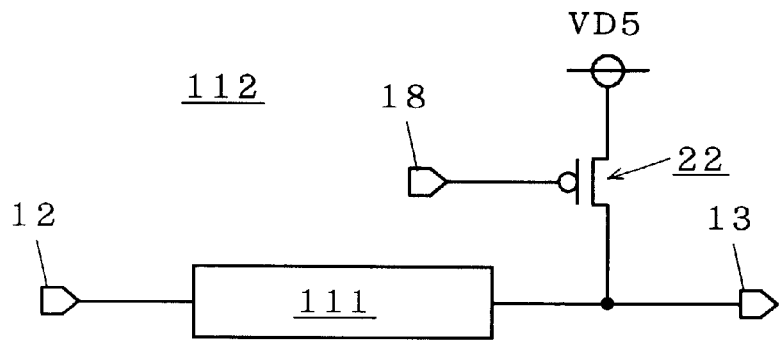
FIG. 4 is a circuit diagram showing a configuration of a second preferred embodiment of the present invention.

FIG. 4 is a circuit diagram showing the configuration of a level shift element 112 according to the second preferred embodiment. Like the level shift element 111, the level shift element 112 can be a component of the level shifter 11b.

The level shift element 112 has a configuration in which a pull-up circuit 22 is added to the output terminal 13 of the level shift element 111. Specifically, the pull-up circuit 22 may comprise a power-supply VD5, a PMOS transistor having a source connected to the power-supply VD5 and a drain connected to an output terminal 13, and a control end 18 connected to the gate of the PMOS transistor.

A signal based on a reset signal in starting the microcomputer 1 that is equipped with the A/D converter 3 having the level shifter 11b, is fed to the control end 18. For a low-active reset signal, a logic signal identical with the reset signal is fed to the control end 18. For a high-active reset signal, a logic signal opposite to the reset signal is fed to the control end 18. Therefore, if a reset signal becomes active, i.e., if a reset is asserted, the potential of the output terminal 13 is forced to be raised to approach the power-supply VD5, resulting in high. That is, the potential of the output terminal 13 is fixed before 3.3 V power-supply system starts.

Besides a reset signal, a control signal for determining an initial state, e.g., a signal for reducing the electric charge of the capacitor of the chopper section, may be fed to the control end 18, resulting in the same effect.

Third Preferred Embodiment

Figure 5:
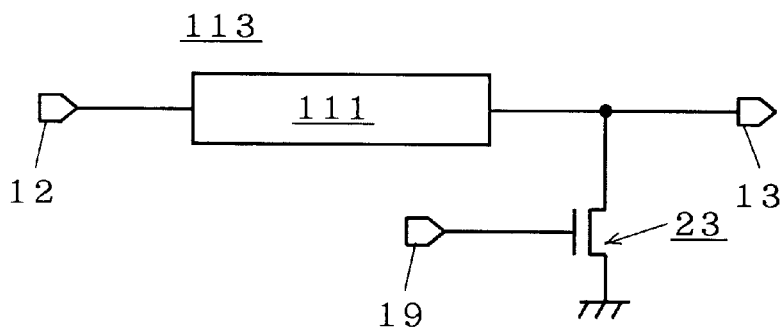
FIG. 5 is a circuit diagram showing a configuration of a third preferred embodiment of the present invention.

FIG. 5 is a circuit diagram showing the configuration of a level shift element 113 according to a third preferred embodiment. Like the level shift element 111, the level shift element 113 can be a component of the level shifter 11b.

The level shift element 113 has a configuration in which a pull-down circuit 23 is added to the output terminal 13 of the level shift element 111. Specifically, the pull-down circuit 23 may comprise a ground power-supply, an NMOS transistor having a source connected to the ground power-supply and a drain connected to the output terminal 13, and a control end 19 connected to the gate of the NMOS transistor.

A signal based on a reset signal in starting a microcomputer 1 that is equipped with the A/D converter 3 having the level shifter 11b, is fed to the control end 19. For a high-active reset signal, a logic signal identical with the reset signal is fed to the control end 19. For a low-active reset signal, a logic signal opposite to the reset signal is fed to the control end 19. Therefore, if a reset signal becomes active, i.e., if a reset is asserted, the potential of the output terminal 13 is forced to be dropped to approach the ground potential, resulting in low. That is, the potential of the output terminal 13 is fixed before 3.3 V power-supply system starts.

Even when a control signal for controlling the analog section 4 is fed to the control end 19, it leads to the same effect, as described in the second preferred embodiment.

Fourth Preferred Embodiment

Figure 6:
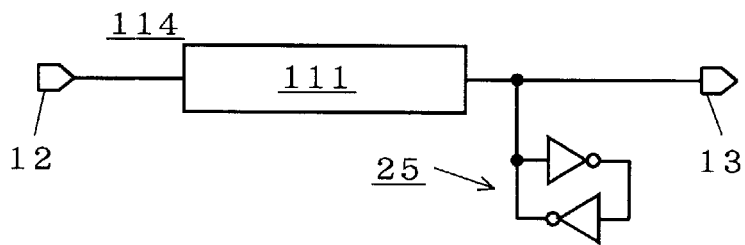
FIG. 6 is a circuit diagram showing a configuration of a fourth preferred embodiment of the present invention.

FIG. 6 is a circuit diagram showing the configuration of a level shift element 114 according to a fourth preferred embodiment. Like the level shift element 111, the level shift element 114 can be a component of the level shifter 11b.

The level shift element 114 has a configuration in which a latched circuit 25 is added to the output terminal 13 of the level shift element 111. The latched circuit 25 comprises a pair of inverters connected in antiparallel with each other and driven by 5 V power-supply system.

Figure 7:
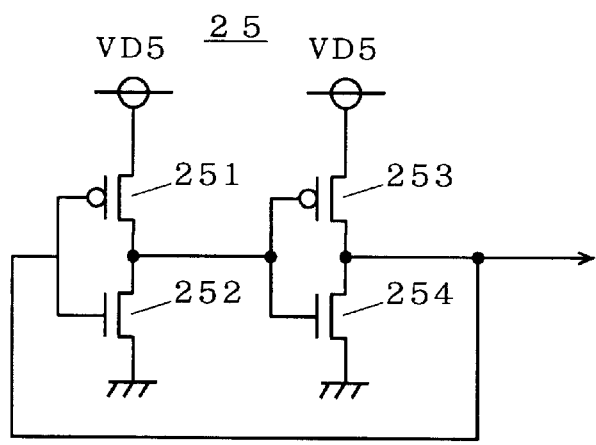
FIG. 7 is a circuit diagram for explaining the fourth preferred embodiment of the present invention.

FIG. 7 is a circuit diagram showing an example of the configuration of a latched circuit 25. The latched circuit 25 comprises PMOS transistors 251, 253 and NMOS transistors 252, 254. Each source of the transistors 251, 253 is connected to a power-supply VD5, and each source of the transistors 252, 254 is grounded. The drains of the transistors 251, 252 are connected in common to the gates of the transistors 253, 254, and the drains of the transistors 253, 254 are connected in common to the gates of the transistors 251, 252 and to the output terminal 13.

When the power-supply VD5 serving as 5 V power-supply system starts, the latched circuit 25 forcedly applies a potential corresponding to a high or low logic to the output terminal 13 before 3.3 V power-supply system starts. Thus, the fourth preferred embodiment provides the same effect as the second or third preferred embodiment, without using a reset signal.

Fifth Preferred Embodiment

Figure 8:
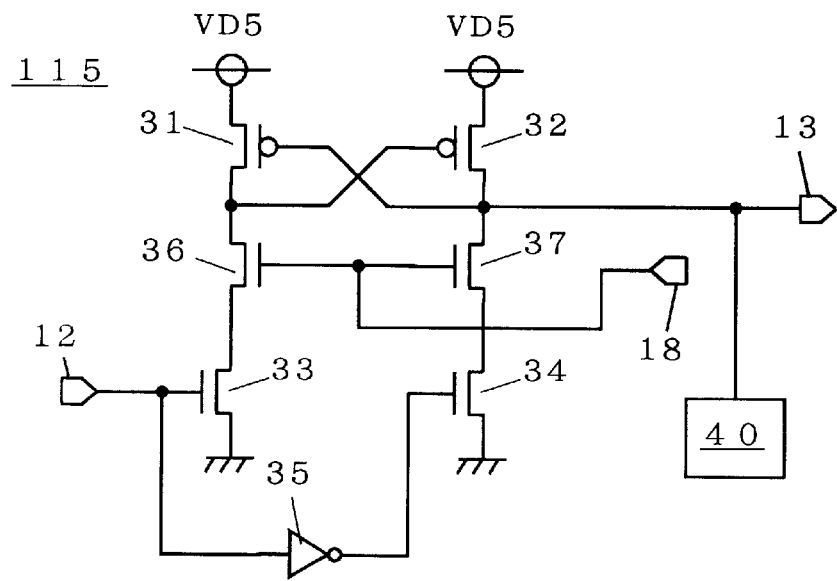
FIG. 8 is a circuit diagram showing a configuration of a fifth preferred embodiment of the present invention.

FIG. 8 is a circuit diagram showing the configuration of a level shift element 115 according to a fifth preferred embodiment. Like the level shift element 111, the level shift element 115 can be a component of the level shifter 11b.

The level shift element 115 differs from the level shift element 111 In that NMOS transistors 36, 37 are added between transistors 31, 33, and between the transistors 32, 34, respectively, and a potential forced circuit 40 is connected to the output terminal 13.

Specifically, each source of the transistors 31, 32 is connected to a power-supply VD5, and each source of the transistors 33, 34 is grounded. The gate of the transistor 31, the drain of the transistor 32, and the drain of the transistor 37 are connected in common to the output terminal 13. The gate of the transistor 32, the drain of the transistor 31, and the drain of the transistor 36 are connected in common. The source of the transistor 36 is connected to the drain of the transistor 33, and the source of the transistor 37 is connected to the drain of the transistor 34. The gate of the transistor 33 is connected to the input terminal 12 together with the input end of an inverter 35, and the gate of the transistor 34 is connected to the output end of the inverter 35. A control end 18 is connected in common to the gates of the transistor 36, 37.

As the potential forced circuit 40, it is possible to employ the pull-up circuit 22, the pull-down circuit 23, and the latched circuit 25, as described in the second to fourth preferred embodiments.

The same signal as being fed to the control end 18 in the second preferred embodiment is fed to the control end 18 of the fifth preferred embodiment. For instance, if applied a low-active reset signal to assert a reset, the transistors 36, 37 become the OFF state, so that the transistors 31, 32 are separated from the transistors 33, 34. It is therefore possible to eliminate more satisfactorily the influence of the unstable operations of the transistors 33, 34 due to the unstable operation of the inverter 35 before 3.3 V power-supply system starts. This permits a forced setting of the potential of the output terminal 13.

While the invention has been shown and described in detail, the foregoing description is in all aspects illustrative and not restrictive. It is therefore understood that numerous modifications and variations can be devised without departing from the scope of the invention.

We claim:

1. An A/D converter comprising:
    an analog section having a functional block for performing an A/D conversion, to which a first voltage is applied;
    a digital section generating a control signal for controlling an operation of said analog section, to which a second voltage having an absolute value smaller than that of said first voltage is applied; and
    a level shifter for shifting a level of said control signal depending on a difference between said first and second voltages and transmits said control signal to said analog section.

2. The A/D converter of claim 1 wherein said level shifter is placed between said analog section and said digital section.

3. The A/D converter of claim 1 wherein said level shifter comprises:
    an input terminal to which said control signal is fed;
    an output terminal for outputting said control signal with shifted level;
    a first path having two ends between which said first voltage is applied, and first and second transistors of different conductivity type which are connected in series between said two ends;
    a logic circuit to which said second voltage is applied, having an input end connected to said input terminal, and an output end connected to a control end of said second transistor;
    a second path having a third transistor of a conductivity type identical with said second transistor, said third transistor including a first current end connected to a first current end of said second transistor, a second current end connected to a control end of said first transistor, and a control end connected to said input terminal; and
    a potential forced circuit to which said first voltage is applied, connected to said output terminal,
    said output terminal being connected to one of current ends of said first transistor closer to said second transistor.

4. The A/D converter of claim 3 wherein,
    said level shifter further comprises a fourth transistor having a conductivity type identical with said first transistor, said fourth transistor including a first current end, a second current end connected to said second current end of said third transistor, and a control end connected to said output terminal; and
    said first voltage is applied between said first current end of said third transistor and said first current end of said fourth transistor.

5. The A/D converter of claim 3 wherein said potential forced circuit is a pull-up circuit.

6. The A/D converter of claim 3 wherein said potential forced circuit is a pull-down circuit.

7. The A/D converter of claim 3 wherein said potential forced circuit is a latched circuit.

8. The A/D converter of claim 3 wherein,
    said first path further has a fourth transistor intervened in series between said output terminal and said second transistor;
    said second path further has a fifth transistor having a conductivity type identical with said fourth transistor, said fifth transistor being intervened in series between said second current end of said third transistor and said control end of said first transistor; and
    said level shifter further comprises a control terminal connected in common to control ends of said fourth and fifth transistors.

9. The A/D converter of claim 8 wherein,
    said level shifter further comprises a sixth transistor having a conductivity type identical with said first transistor, said sixth transistor including a first current end, a second current end connected to said second current end of said fifth transistor, and a control end connected to said output terminal; and
    said first voltage is applied between said first current end of said sixth transistor and said first current end of said third transistor.

10. The A/D converter of claim 8 wherein said potential forced circuit is a pull-up circuit.

11. The A/D converter of claim 8 wherein said potential forced circuit is a pull-down circuit.

12. The A/D converter of claim 8 wherein said potential forced circuit is a latched circuit.

13. A level shifter comprising:
    an input terminal;
    an output terminal for outputting a signal fed to said input terminal with shifted level;
    a first path having two ends between which a first voltage is applied, and first and second transistors of different conductivity type which are connected in series between said two ends;
    a logic circuit to which a second voltage different from said first voltage is applied, having an input end connected to said input terminal, and an output end connected to a control end of said second transistor;
    a second path having a third transistor of a conductivity type identical with said second transistor, said third transistor including a first current end connected to a first current end of said second transistor, a second current end connected to a control end of said first transistor, and a control end connected to said input terminal; and a potential forced circuit to which a first voltage is applied, connected to said output terminal, said output terminal being connected to one of current ends of said first transistor closer to said second transistor.

14. The level shifter of claim 13 wherein said potential forced circuit is a pull-up circuit.

15. The level shifter of claim 13 wherein said potential forced circuit is a pull-down circuit.

16. The level shifter of claim 13 wherein said potential forced circuit is a latched circuit.

17. The level shifter of claim 13 further comprising a control terminal wherein, said first path further has a fourth transistor intervened in series between said output terminal and said second transistor;

said second path further has a fifth transistor having a conductivity type identical with said fourth transistor, said fifth transistor being intervened in series between said second current end of said third transistor and said control end of said first transistor; and said control terminal is connected in common to control ends of said fourth and fifth transistors.

18. The level shifter of claim 17 wherein said potential forced circuit is a pull-up circuit.

19. The level shifter of claim 17 wherein said potential forced circuit is a pull-down circuit.

20. The level shifter of claim 17 wherein said potential forced circuit is a latched circuit.

* * * * *